US 9,679,630 B2

United States Patent
Carver et al.

(10) Patent No.: US 9,679,630 B2
(45) Date of Patent: Jun. 13, 2017

(54) ELECTROENTROPIC MEMORY DEVICE

(71) Applicant: Carver Scientific, Inc., Baton Rouge, LA (US)

(72) Inventors: David Reginald Carver, Baton Rouge, LA (US); Sean Claudius Hall, Baton Rouge, LA (US); Chase Koby Andrepont, Prairieville, LA (US); Sean William Reynolds, Baton Rouge, LA (US); Jaime Hayes Gibbs, Pensacola, FL (US); Bradford Wesley Fulfer, Baton Rouge, LA (US)

(73) Assignee: Carver Scientific, Inc., Baton Rouge, LA (US)

( * ) Notice: Subject to any disclaimer, the term of this patent is extended or adjusted under 35 U.S.C. 154(b) by 0 days.

(21) Appl. No.: 15/343,779

(22) Filed: Nov. 4, 2016

(65) Prior Publication Data

US 2017/0133077 A1    May 11, 2017

Related U.S. Application Data

(60) Provisional application No. 62/252,216, filed on Nov. 6, 2015.

(51) Int. Cl.
*G11C 13/04* (2006.01)
*G11C 11/406* (2006.01)
(Continued)

(52) U.S. Cl.
CPC .......... *G11C 11/406* (2013.01); *C08L 101/12* (2013.01); *G11C 11/22* (2013.01);
(Continued)

(58) Field of Classification Search
CPC ......... G11C 11/406; G11C 11/22; H01G 7/06; H01G 7/02; H01G 7/021; C08L 101/12; C08L 2203/20; C08L 2205/025
(Continued)

(56) References Cited

U.S. PATENT DOCUMENTS 2,778,762 A    1/1957    Eisler
2,798,990 A    7/1957    Davis
(Continued)

FOREIGN PATENT DOCUMENTS

WO    WO 2008/082045 A1    7/2008

OTHER PUBLICATIONS

International Search Report and Written Opinion from International application No. PCT/US2016/060453, dated Mar. 9, 2017.
(Continued)

*Primary Examiner* — Gene Auduong
(74) *Attorney, Agent, or Firm* — Klarquist Sparkman, LLP

(57) ABSTRACT

Embodiments of an electroentropic memory device comprising an array of electroentropic storage devices (EESDs) are disclosed, as well as methods of making and using the electroentropic memory device. The memory device includes a plurality of address lines arranged in rows to select a row of the EESDs and a plurality of data lines arranged in columns to select a column of the EESDs, wherein each EESD is coupled in series between an address line connected to one side of the EESD and a data line connected to an opposing side of the EESD. The memory device may have a stacked architecture with multiple layers of address lines, data lines, and EESDs. The disclosed electroentropic memory devices are operable in ROM and RAM modes. EESDs in the disclosed electroentropic memory devices may include from 2-4096 logic states and/or have a density from 0.001 kb/cm$^3$ to 1024 TB/cm$^3$.

20 Claims, 8 Drawing Sheets

(51) Int. Cl.
*H01G 7/06* (2006.01)
*C08L 101/12* (2006.01)
*G11C 11/22* (2006.01)
*H01G 7/02* (2006.01)

(52) U.S. Cl.
CPC ............ *H01G 7/06* (2013.01); *C08L 2203/20* (2013.01); *C08L 2205/025* (2013.01); *H01G 7/02* (2013.01); *H01G 7/021* (2013.01)

(58) Field of Classification Search
USPC .................................. 365/108, 145, 163, 222
See application file for complete search history.

(56) References Cited

U.S. PATENT DOCUMENTS

| | | | |
|---|---|---|---|
| 3,342,754 A | 9/1967 | Gorham | |
| 3,535,602 A | 10/1970 | Hrach et al. | |
| 3,616,314 A | 10/1971 | Settineri et al. | |
| 3,907,748 A | 9/1975 | Marvel et al. | |
| 4,333,418 A | 6/1982 | Nagel et al. | |
| 4,359,327 A | 11/1982 | Armand et al. | |
| 4,500,562 A | 2/1985 | Jahn et al. | |
| 4,532,369 A | 7/1985 | Harner | |
| 4,638,407 A | 1/1987 | Lundsgaard | |
| 4,675,462 A | 6/1987 | Ungarelli et al. | |
| 4,734,533 A | 3/1988 | Ungarelli et al. | |
| 4,748,542 A | 5/1988 | Lundsgaard | |
| 4,769,505 A | 9/1988 | Lee et al. | |
| 4,795,838 A | 1/1989 | Bornengo et al. | |
| 4,806,702 A | 2/1989 | Lee et al. | |
| 4,816,608 A | 3/1989 | Bornengo et al. | |
| 4,849,559 A | 7/1989 | Lee et al. | |
| 4,853,488 A | 8/1989 | Ungarelli et al. | |
| 4,886,923 A | 12/1989 | Ungarelli et al. | |
| 4,942,061 A | 7/1990 | Domes | |
| 4,963,429 A | 10/1990 | Norian et al. | |
| 5,079,674 A | 1/1992 | Malaspina | |
| 5,110,903 A | 5/1992 | Lee et al. | |
| 5,144,529 A | 9/1992 | Takahashi | |
| 5,266,291 A | 11/1993 | Drnevich et al. | |
| 5,783,933 A | 7/1998 | Bailly | |
| 6,096,234 A | 8/2000 | Nakanishi et al. | |
| 6,307,735 B1 | 10/2001 | Saito et al. | |
| 6,602,741 B1 | 8/2003 | Kudoh et al. | |
| 6,674,635 B1 | 1/2004 | Fife et al. | |
| 7,033,406 B2 | 4/2006 | Weir et al. | |
| 7,117,044 B2* | 10/2006 | Kocher .................. | G05B 11/42 700/295 |
| 7,164,197 B2 | 1/2007 | Mao et al. | |
| 7,170,260 B2 | 1/2007 | Thrap | |
| 7,190,016 B2 | 3/2007 | Cahalen et al. | |
| 7,279,777 B2 | 10/2007 | Bai et al. | |
| 7,342,755 B1 | 3/2008 | Horvat et al. | |
| 7,429,317 B2 | 9/2008 | Paul, II | |
| 7,495,887 B2 | 2/2009 | Cox | |
| 7,781,358 B2 | 8/2010 | Hackenberger et al. | |
| 8,270,209 B2 | 9/2012 | Herr et al. | |
| 8,289,676 B2 | 10/2012 | Giannantonio et al. | |
| 8,382,042 B2 | 2/2013 | Sanderson et al. | |
| 8,432,663 B2 | 4/2013 | Carver | |
| 8,633,289 B2 | 1/2014 | Carver et al. | |
| 8,687,403 B1 | 4/2014 | Derhacobian et al. | |
| 8,791,444 B2 | 7/2014 | Chin et al. | |
| 8,792,275 B2 | 7/2014 | Shih et al. | |
| 8,940,850 B2 | 1/2015 | Carver et al. | |
| 9,011,627 B2 | 4/2015 | Carver | |
| 9,214,280 B2 | 12/2015 | Carver et al. | |
| 9,214,281 B2 | 12/2015 | Carver et al. | |
| 9,531,198 B2 | 12/2016 | Carver | |
| 2004/0210289 A1* | 10/2004 | Wang .................. | A61K 9/5094 607/116 |
| 2005/0058009 A1 | 3/2005 | Yang et al. | |
| 2005/0107870 A1* | 5/2005 | Wang ..................... | A61L 31/10 623/1.44 |
| 2005/0143846 A1* | 6/2005 | Kocher ................. | G05B 11/42 700/34 |
| 2006/0034035 A1 | 2/2006 | Maruo et al. | |
| 2006/0065045 A1 | 3/2006 | Borwick, III et al. | |
| 2006/0074164 A1 | 4/2006 | Slenes et al. | |
| 2006/0191443 A1 | 8/2006 | Yamaguchi et al. | |
| 2008/0001137 A1 | 1/2008 | Kozicki et al. | |
| 2008/0171230 A1 | 7/2008 | Zou et al. | |
| 2008/0180876 A1 | 7/2008 | Shimanouchi et al. | |
| 2010/0033899 A1 | 2/2010 | Koh et al. | |
| 2012/0127122 A1 | 5/2012 | Lim | |
| 2012/0241085 A1 | 9/2012 | Carver | |
| 2013/0224397 A1 | 8/2013 | Carver | |
| 2014/0071732 A1 | 3/2014 | Khalili Amiri et al. | |
| 2014/0295101 A1 | 10/2014 | Carver | |
| 2015/0017342 A1 | 1/2015 | Carver et al. | |
| 2015/0019802 A1 | 1/2015 | Kamal et al. | |
| 2015/0028279 A1 | 1/2015 | Hopstaken et al. | |
| 2015/0131198 A1 | 5/2015 | Carver et al. | |
| 2015/0131205 A1 | 5/2015 | Amaratunga et al. | |
| 2015/0206658 A1 | 7/2015 | Carver | |
| 2015/0206659 A1 | 7/2015 | Carver | |
| 2015/0235769 A1 | 8/2015 | Carver et al. | |
| 2015/0270710 A1* | 9/2015 | Carver .................. | H02J 7/0024 307/109 |
| 2016/0064153 A1 | 3/2016 | Carver et al. | |

OTHER PUBLICATIONS

Wang et al., "On the energy conversion and efficiency of a dielectric electroactive polymer generator," *Applied Physics Letters*, Jul. 16, 2017, 101(3):33904-1 to 33904-5.

*Intel and Micron Produce Breakthrough Memory Technology*, Intel Corporation, 7 pp., Jul. 28, 2015.

* cited by examiner

ELECTROENTROPIC MEMORY DEVICE

CROSS-REFERENCE TO RELATED APPLICATION

This application claims the benefit of the earlier filing date of U.S. Provisional Application No. 62/252,216, filed Nov. 6, 2015, which is incorporated by reference in its entirety.

FIELD

This disclosure concerns embodiments of an electroentropic memory device and methods for making and using the device.

BACKGROUND

The field of microelectronics and related technologies is a rapidly expanding and innovative technological market for new products. Advances for over 50 years have fueled remarkable achievements in products that were rarely even envisioned by futurists five decades ago. Part of the rapid evolution of the products in these markets has been attributed to the incredible developments in microelectronics for computers and other logic devices. In these computers and logic devices, a primary component is a memory device for the execution of programs and storage of data.

There are two general types of data memory devices used in computers today, "non-volatile" and "volatile" memory devices. Non-volatile memory devices include read-only memory (ROM), erasable programmable ROM (EPROM), and electrically erasable programmable ROM (EEPROM). "Non-volatile" memory derives its name from the characteristic of a device that does not lose its data contents even when the electrical power to the device is removed. Volatile memory devices such as dynamic random-access memory (DRAM) and static random-access memory (SRAM) devices are different in that the data contents rapidly dissipate when power to the devices is removed. RAM devices are used due to their ability to rapidly reiterate and accept data (read and write). The current state of RAM and ROM memory devices is such that rapid access to the information stored in such devices can be fast (i.e. <20 ns). However, conventional memory devices suffer from the necessity of a complex system of transistors to control data retention and facilitate rapid energy state switching.

A major disadvantage of RAM devices is the data stored in the memory cells of the chip is lost when power is removed. Another disadvantage is that RAM devices are relatively expensive compared to their ROM counterparts. Yet another disadvantage is that as RAM memory devices are reduced in size in order to gain higher densities of data storage, their ability to be manufactured and used with high reliability is decreasing. Thus, the necessity for increased data storage, reduced cost per unit data, increased reliability, and non-volatile storage are important characteristics that are in need of improvement.

SUMMARY

Embodiments of an electroentropic memory device include (i) an array of electroentropic storage devices (EESDs), each EESD comprising a dielectric material, wherein each EESD is a storage element in the memory device; (ii) a plurality of address lines arranged in rows to select a row of the EESDs; and (iii) a plurality of data lines arranged in columns to select a column of the EESDs, wherein each EESD is coupled in series between an address line connected to one side of the EESD and a data line connected to an opposing side of the EESD. A spatial separation is present at each intersection where a data line crosses an address line, and each of the spatial separations is occupied by an EESD coupled in series between the address line and the data line. Advantageously, the memory device may not include a transistor. Alternatively, the memory device may have a transistor to EESD ratio of less than one.

In some embodiments, the dielectric material comprises a plurality of polymeric molecules. The dielectric material may further comprise an inorganic salt. In certain embodiments, the dielectric material further comprises a permittivity increasing material, which is substantially evenly distributed throughout the material. In some embodiments, each of the plurality of address lines and/or the plurality of data lines comprises an electrically insulated metal, a carbonized polymer, conductive carbon, or an electrically conductive polymer.

In any or all of the above embodiments, each EESD may have a logic state determined by a voltage applied between the address line and the data line to which the EESD is coupled. In some embodiments, the voltage modifies the intrinsic capacitance of the EESD. In any or all of the above embodiments, the EESD may have from 2-4096 logic states, a volume of 0.00001-10000 $\mu m^3$, and/or a density within a range of from 0.01 kb to 1024 TB per $cm^3$.

Some embodiments of an electroentropic memory device as disclosed herein have a layered structure including (i) a first layer of electrodes arranged in rows; (ii) a second layer of electrodes arranged in columns, wherein there are first spatial separations at each intersection where an electrode of the second layer crosses an electrode of the first layer; (iii) a first array of EESDs, wherein the EESDs of the first array are located in the first spatial separations and each EESD is coupled in series between an electrode of the first layer connected to one side of the EESD and an electrode of the second layer connected to an opposing side of the EESD; (iv) a third layer of electrodes arranged in rows crossing the second layer of electrodes, wherein there are second spatial separations at each intersection where an electrode of the third layer crosses an electrode of the second layer; and (v) a second array of EESDs, wherein the EESDs of the second array are located in the second spatial separations and each EESD of the second array is coupled in series between an electrode of the second layer connected to one side of the EESD and an electrode of the third layer connected to an opposing side of the EESD. In some embodiments, the memory device includes additional layers. For example, the memory device may further include (vi) a fourth layer of electrodes arranged in columns crossing the third layer of electrodes, wherein there are third spatial separations at each intersection where an electrode of the fourth layer crosses an electrode of the third layer; and (vii) a third array of EESDs, wherein each EESD of the third array is a storage element in the memory device, and wherein the EESDs of the third array are located in the third spatial separations and each EESD of the third array is coupled in series between an electrode of the third layer connected to one side of the EESD and an electrode of the fourth layer connected to an opposing side of the EESD. Additional layers can be added as desired.

Embodiments of a method for refreshing an electroentropic memory device include (i) providing an array of entropic energy storage devices (EESDs), wherein each EESD is a storage element in the memory device; (ii) charging an EESD in the array to a voltage V1, wherein the voltage V1 discharges, at least in part, due to leakage over time; (iii) subsequently determining a capacitance C of the EESD; (iv) determining, based on the capacitance C, the voltage V1; and recharging the EESD to the voltage V1. In some embodiments, the capacitance C is correlated to the voltage V1 and the capacitance C remains substantially unchanged as the voltage V1 discharges due to leakage.

In any or all of the above embodiments, determining the capacitance C of the EESD may include (a) reading a voltage V of the EESD; (b) applying a perturbing charge dQ to the EESD, wherein the perturbing charge dQ has a magnitude sufficient to induce a change in the voltage V without inducing a change in the capacitance C; (c) subsequently reading a voltage V' of the EESD; and (d) determining the capacitance C, where $C=dQ/(V'-V)$. In one embodiment, the perturbing charge dQ has a magnitude approximately equal to a magnitude of discharge due to leakage over time. The magnitude of discharge may be 0.1-50% of a charge capacity of the EESD. In an independent embodiment, the perturbing charge dQ has a magnitude within a range of $1\times10^{-15}$ coulombs to $1\times10^{-3}$ coulombs.

In any or all of the above embodiments, determining the initial voltage V1 prior to leakage may include comparing the capacitance C of the EESD to predetermined capacitance values for the EESD in charged and uncharged states, thereby correlating the capacitance C to the voltage V1. In any or all of the above embodiments, recharging the EESD to the voltage V1 may include selecting a voltage V2 sufficient to recharge the EESD to the voltage V1, and writing the selected voltage V2 to the EESD, thereby recharging the EESD to the voltage V1.

The foregoing and other objects, features, and advantages of the invention will become more apparent from the following detailed description, which proceeds with reference to the accompanying figures.

DETAILED DESCRIPTION

Figure 1:
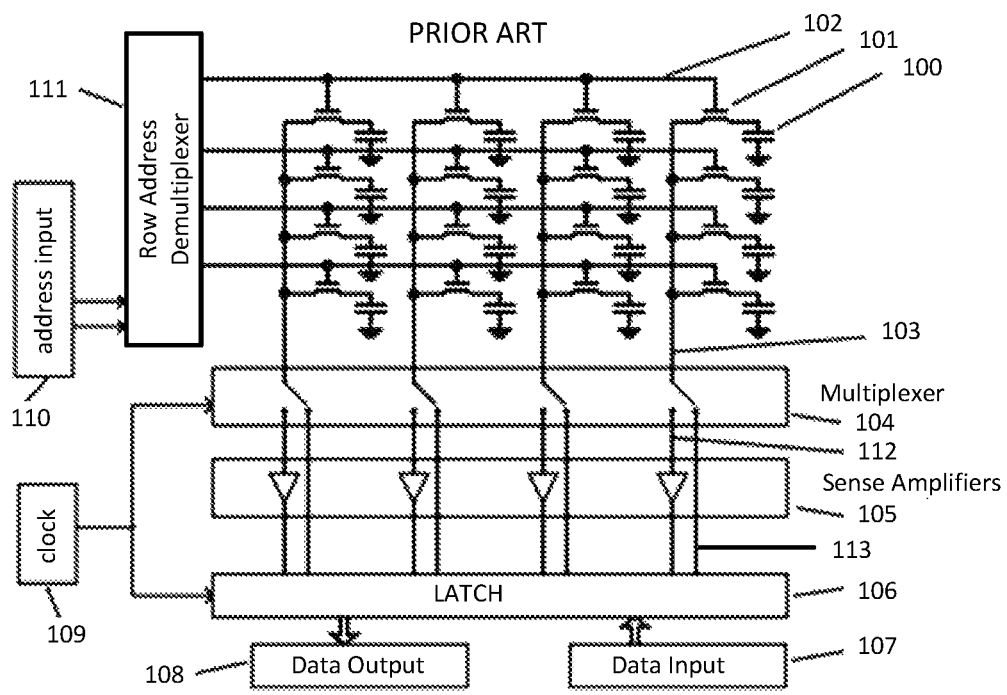
FIG. 1 is a schematic diagram of a conventional dynamic random-access memory device including capacitors and transistors.

Embodiments of electroentropic memory devices, such as logical memory devices used by computational devices, and methods of using such devices are disclosed. Embodiments of the disclosed memory devices include one or more electroentropic storage devices (EESDs), and can be used as ROM and/or RAM memory devices for long-term, non-volatile storage or for short-term, volatile retention of information in digital format. Advantageously, the disclosed memory devices include no transistors or substantially fewer transistors than conventional ROM and RAM memory devices.

I. Definitions

The following explanations of terms and abbreviations are provided to better describe the present disclosure and to guide those of ordinary skill in the art in the practice of the present disclosure. As used herein, "comprising" means "including" and the singular forms "a" or "an" or "the" include plural references unless the context clearly dictates otherwise. The term "or" refers to a single element of stated alternative elements or a combination of two or more elements, unless the context clearly indicates otherwise.

Unless explained otherwise, all technical and scientific terms used herein have the same meaning as commonly understood to one of ordinary skill in the art to which this disclosure belongs. Although methods and materials similar or equivalent to those described herein can be used in the practice or testing of the present disclosure, suitable methods and materials are described below. The materials, methods, and examples are illustrative only and not intended to be limiting. Other features of the disclosure are apparent from the following detailed description and the claims.

Unless otherwise indicated, all numbers expressing quantities of components, voltages, temperatures, times, and so forth, as used in the specification or claims are to be understood as being modified by the term "about." Accordingly, unless otherwise indicated, implicitly or explicitly, the numerical parameters set forth are approximations that may depend on the desired properties sought and/or limits of detection under standard test conditions/methods as known to those of ordinary skill in the art. When directly and explicitly distinguishing embodiments from discussed prior art, the embodiment numbers are not approximates unless the word "about" is recited.

In order to facilitate review of the various embodiments of the disclosure, the following explanations of specific terms are provided:

Address line: As used herein, the term "address line" refers to an electrode, or select line, used to select a row of energy storage devices.

Capacitance: The ability of a body to store an electrical charge. Capacitance is defined as $$C = \frac{Q}{V},$$

where Q is charge (coulombs) and V is potential (volts). Capacitance is typically expressed in farads, where 1 F=1 C/1V.

Cell: As used herein, the term "cell" refers to an address line, a data line, an EESD, and, if present, an insulative layer.

Data line: As used herein, the term "data line" refers to an electrode, or read/write line, connected to a column of energy storage devices and used to read or write to the energy storage devices.

Demultiplexer: A circuit that has one input and more than one output. As used herein, the demultiplexer receives an address input signal and selects a line (an "address line") to which the signal is sent.

Dielectric material: An electrical insulator that can be polarized by an applied electric field.

DRAM: Dynamic random-access memory.

EESD: Electroentropic storage device or entropic energy storage device. As used herein, the term EESD refers to a capacitor-like device wherein the dielectric material is an entropic material as defined below.

Electrically insulative material or insulator: An insulator is a material having internal electric charges that do not flow freely, and therefore the material conducts little or no electric current. Recognizing that perfect insulators do not exist, as used herein, the term "electrically insulative material" refers to a material that is primarily insulative, i.e., a material that has a threshold breakdown field that exceeds an electric field applied across the material during normal use as a capacitor, thus avoiding electrical breakdown during normal use.

Entropic material: A material in which energy is stored via entropic changes of the material. In some examples, the entropic changes are driven by electrical means, and the material is referred to as an Electroentropic™ material. In other examples, the entropic changes are driven by magnetic fields, and the material is referred to as a Magnetoentropic™ material. Entropic changes include atomic, molecular, secondary, and/or tertiary structure changes, such as intramolecular movement of polymers and/or intermolecular movement of charged or polar molecular species within the material. Embodiments of the disclosed entropic materials comprise a plurality of polymeric molecules, particularly polymeric molecules including one or more polar functional groups and/or ionizable functional groups.

Insulative or nonconductive layer/coating: As used herein, the terms "insulative layer," "insulative coating," "nonconductive layer," and "nonconductive coating" refer to a layer or coating of a material that is electrically insulative from an Ohmic conductivity standpoint, i.e., the material has an Ohmic conductivity less than $1 \times 10^{-1}$ S/m (Siemens per meter).

Line/Electrode: As used herein, the terms "line" and "electrode" are used interchangeably to refer to an electrical conductor (e.g., a metal) or to a "composite" electrode comprising an electrical conductor and a nonconductive material on the surface of the electrical conductor. Exemplary electrodes include metals, electrically insulated metals, carbonized polymers, conductive carbon, and electrically conductive polymers.

Multiplexer: A circuit that selects one of several input signals (e.g., from a read line) and sends the signal to a single output.

Parylene: Polymerized p-xylylene, also known as a Puralene™ polymer (Carver Scientific, Inc.), or polymerized substituted p-xylylene. Poly(p-xylylene) satisfies the formula:

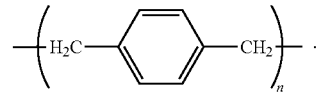

Permittivity: As used herein, the term "permittivity" refers to the ability of a material to become polarized, thereby changing the "dielectric constant" of its volume of space to a higher value than that of a vacuum. The relative permittivity of a material is a measurement of its static dielectric constant divided by the dielectric constant of a vacuum as shown in Eq. 2.

$$e_r = \frac{e_s}{e_0} \quad \text{Eq. 2}$$

where: $e_r$=relative permittivity, $e_s$=measured permittivity, and $e_o$=electrical permittivity of vacuum ($8.8542 \times 10^{-12}$ F/m). A vacuum has a relative permittivity of 1, whereas water has a relativity permittivity of 80.1 (at 20° C.) and an organic coating typically has a relative permittivity of 3-8. Generally, speaking the term "high permittivity" refers to a material having a relative permittivity of at least 3.3. As used herein, the term "high permittivity" also refers to a material having a permittivity enhanced by at least 10% using a permittivity enhancement technique, such as immersion in an electric field.

Perturbing charge: A charge applied to an electroentropic energy device, the charge having a magnitude effective to cause a change in the voltage of the device without changing the capacitance of the device.

Polar: The term "polar" refers to a compound, or a functional group within a compound, in which electrons are not equally shared between the atoms i.e., areas of positive and negative charges are at least partially permanently separated.

Polymer/polymeric molecule: A molecule of repeating structural units (e.g., monomers) formed via a chemical reaction, i.e., polymerization.

ROM: Read-only memory.

II. Memory Devices

Many memory-type devices are constructed from capacitive cells where the capacitor stores "charge" of little charge, no charge, or a higher charge state wherein a higher voltage designates a different logic state from the lower charge state of lesser voltage. These devices are well known and numerous publications show their construction. One such device is the DRAM (Dynamic Random Access Memory), which is the most dense memory device readily available. Due to their simple construction, DRAM devices can be made using silicon micro-fabrication techniques. They utilize a capacitor that stores charge and a transistor to provide switching from the capacitor's electrode to the sensing electronics and output logic circuits.

As shown in FIG. 1, a matrix of capacitive elements 100 is formed and sensed in rows and columns. Address lines or electrodes 102 select a row of capacitive elements 100, and data lines or electrodes 103 select a column of capacitive elements 100. The memory device further includes a multiplexer 104, sense amplifiers 105, a latch 106, a data input 107, a data output 108, a clock 109, an address input 110, a row address demultiplexer 111, read lines 112, and write lines 113. The salient feature of FIG. 1 is the presence of a transistor driver 101 adjacent to each memory cell or capacitive element 100. The capacitive element 100 requires its own individual transistor driver 101 in order to function. Thus, the memory device of FIG. 1 has a 1:1 ratio of transistors to capacitors. The transistor driver 101 provides a connection to one of the electrodes of the capacitive memory 100 to the latch 106. This enables writing of the information to the memory. Switching the multiplexer 104 to its alternative position enables reading the memory position selected by the row address demultiplexer 111.

This complex array of capacitors and switches has been reproduced many times in order to increase both the memory size and to reduce the cost per bit of memory. However, the memory device of FIG. 1 suffers from several limitations:
1) each memory cell is comprised of a capacitor that contains typically one or two states of charge;
2) each memory cell has at least one transistor associated with it;
3) each memory cell must be recharged multiple times per second in order for the charge on the capacitor to be read properly; and
4) each memory cell is constructed in silicon.

Figure 2:
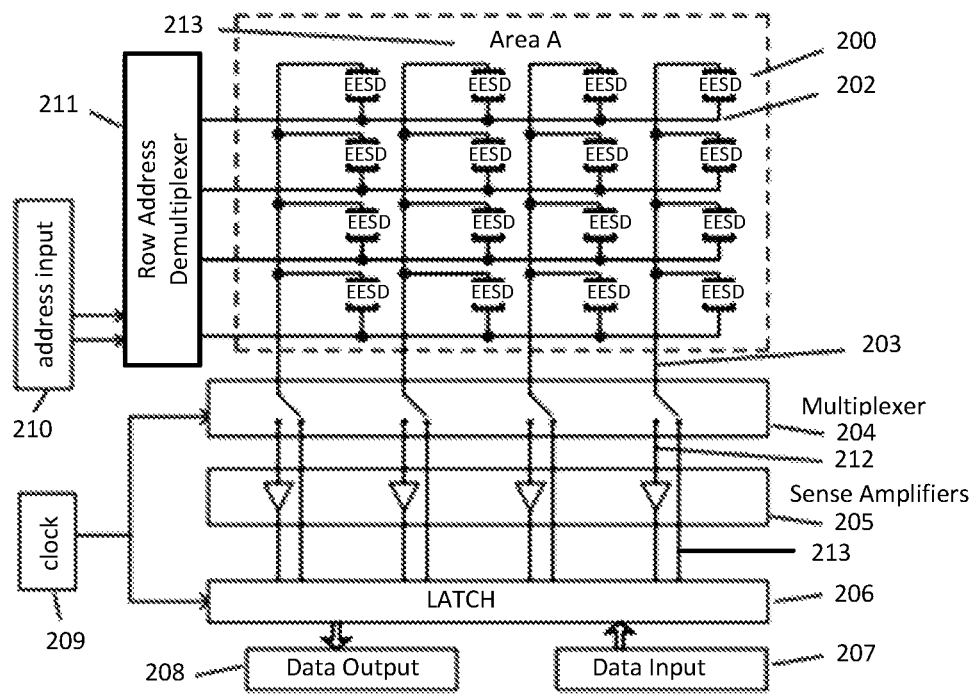
FIG. 2 is a schematic diagram of one embodiment of an electroentropic memory device.

FIG. 2 illustrates one embodiment of a different memory device as disclosed herein. The memory device of FIG. 2 includes a plurality of electroentropic storage devices (EESDs) 200, a plurality of address lines or electrodes 202 arranged in rows to select a row of the EESDs 200, a plurality of data lines or electrodes 203 arranged in columns to select a column of the EESDs 200, a multiplexer 204, sense amplifiers 205, a latch 206, a data input 207, a data output 208, a clock 209, an address input 210, a row address demultiplexer 211, read lines 212, and write lines 213.

The major differences between the memory devices of FIG. 1 and FIG. 2 are the elimination of the transistors associated with each memory storage capacitor in Area A, and the capacitor has been changed to an electroentropic storage device (EESD). Embodiments of the disclosed electroentropic memory devices have a transistor to EESD ratio less than 1:1. In some embodiments, an electroentropic memory device may have a single transistor associated with each row and/or each column of EESDs. In certain embodiments, an electroentropic memory device has no transistors associated with the EESDs.

Another major difference is that, due to the elimination of transistors, Area A does not have to be made from silicon or other expensive transistor substrates. Area A could, for example, be made of plastic or another nonconductive material. A third advantage of the arrangement is the ability of the completed array of capacitive elements to be "stacked" one on top of each other. Due to the lack of heat generated during the charging and discharging process and the absence of substantial leakage current, these arrays can be stacked on top of each other virtually without limitation. A practical limit is reached when the height of the array becomes difficult to align with the base layer. Misalignment in the attachment of the row and column metallic layers could then become a problem.

Embodiments of the disclosed electroentropic memory devices comprise (i) an array of EESDs, each EESD comprising a dielectric material, wherein each EESD is a storage element in the memory device, (ii) a plurality of address lines or electrodes arranged in rows to select a row of the EESDs, and (iii) a plurality of data lines or electrodes arranged in columns to select a column of the EESDs, wherein each EESD is coupled in series between an address line connected to one side of the EESD and a data line connected to an opposing side of the EESD. In some embodiments, each EESD comprises a dielectric material having a relative permittivity greater than 3.9 (the relative permittivity of silicon dioxide). A spatial separation is present at each intersection where a data line crosses an address line, and each of the spatial separations is occupied by an EESD coupled in series between the address line and the data line. Each electrode (address line or data line) may have a cross-section as desired, such as a rectangular, circular, or ovoid cross sectional profile.

In some embodiments, each of the plurality of address lines and/or the plurality of data lines comprises an electrically insulated metal, a carbonized polymer, or an electrically conductive polymer. An electrically insulated metal may be coated with a self-assembled monolayer, poly(p-xylylene), or a combination thereof. In some embodiments, the address lines and/or data lines are disposed on a non-silicon substrate.

Some embodiments of the disclosed memory devices do not include a transistor. In certain embodiments, the memory device may include one or more transistors, and the memory device has a transistor to EESD ratio of less than one. For example, there may be one transistor for each row or column of EESDs.

An EESD is a capacitive energy storage device. Capacitors are electrical energy storage devices. Within the context of energy storage, these devices have a substantial ability to store energy on both a weight and volume basis. With dilution by less than 70% of the inactive portions of the energy storage device, the electrical energy storage can be in the range of 0.01 to 200 Wh/kg and 0.02 to 400 J/cm$^3$. Packaging may substantially decrease the range of those energy storage values as known to those familiar with the mechanical requirements of capacitor mounting. As described below, an EESD can function as a memory device.

Each EESD has a logic state determined by a voltage applied between the address line and the data line to which the EESD is coupled. The EESD has an "intrinsic capacitance" when it is first manufactured in an unpolarized state or starting state (e.g., the state of the EESD after manufacture under the influence of an electric or magnetic field), which can be modified by the applied voltage. In some embodiments, the intrinsic capacitance of the dielectric remains unchanged when an applied voltage is used to charge the capacitor and is then removed. In other embodiments the "intrinsic capacitance" of the dielectric is modified when an applied voltage is used to charge the capacitor and is then removed.

As discussed further below, an EESD may have from 2-4096 logic states. In some embodiments, each EESD has a volume within a range of 0.00001-10000 μm$^3$. In certain embodiments, each EESD has a density within a range of from 0.01 kb to 1024 TB per cm$^3$.

Figure 3:
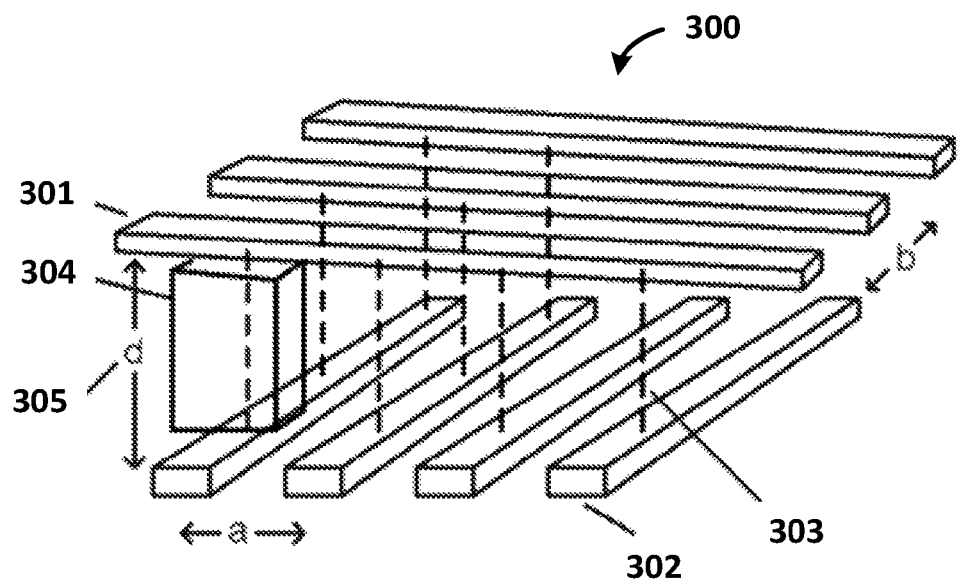
FIG. 3 is a perspective view of an exemplary arrangement of a single-layer capacitive grid including address lines, read lines, and an electroentropic storage device (EESD) as disclosed herein.

FIG. 3 is a perspective diagram of one embodiment of a single-layer capacitive grid 300 for a memory device as disclosed herein. A plurality of address lines or electrodes 301 is arranged in parallel rows, and a plurality of data lines or electrodes 302 is arranged in parallel columns, wherein the columns are perpendicular to the rows. The address lines 301 and data lines 302 independently may have a separation a, b, respectively, of 25 nm to 60 μm, such as from 100 nm to 60 μm. Each address line and data line may have a width within a range of 20 nm to 50 µm. such as from 50 nm to 50 µm. The spacing between adjacent address lines or adjacent data lines is typically 0.05 µm. A plurality of EESDs 304 is positioned in gaps 305 at intersections 303 of the address lines 301 and the data lines 302, the gaps 305 having a height d. In some embodiments, the height d is within a range of 2 nm to 1 mm. There are two electrodes or lines connected to each EESD. The capacitive grid 300 can be connected to an interconnection plane (not shown) to route it to the control electronics by a variety of methods known to those in the semiconductor fabrication industry. One such method is shown in FIG. 4.

Figure 4:
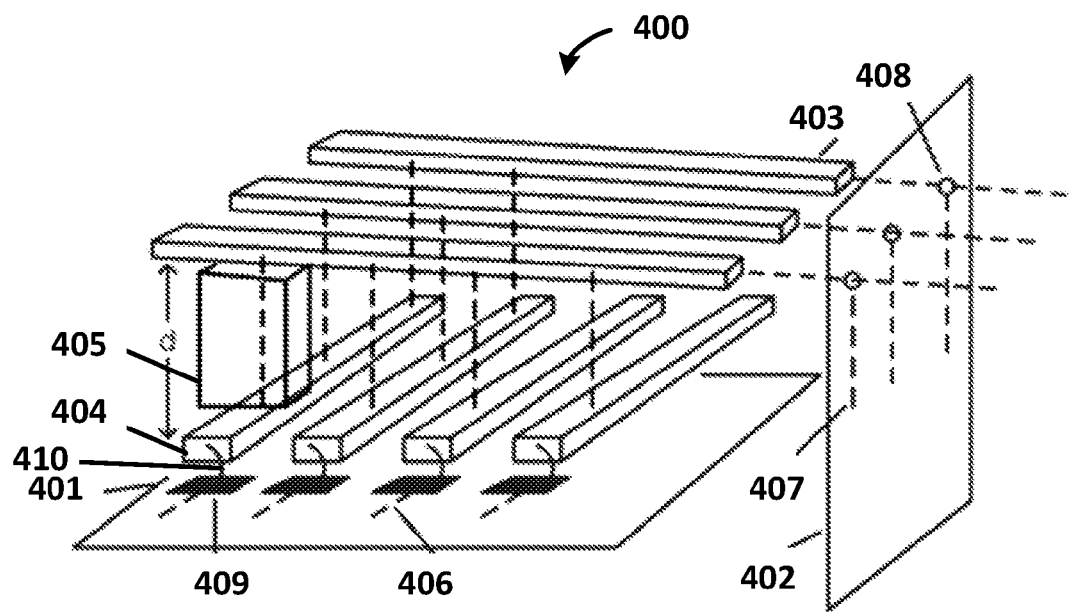
FIG. 4 is a perspective view of an exemplary arrangement of a single-layer capacitive grid connected to interconnection planes.

FIG. 4 is a perspective diagram of one embodiment of a single-layer capacitive grid 400 for a memory device as disclosed herein. Nonconductive substrates or planes 401, 402 support a plurality of address lines or electrodes 403 and data lines or electrodes 404, respectively. A plurality of EESDs 405 is positioned in gaps at intersections of the data lines 403 and address lines 404. The nonconductive substrates 401, 402 include patterned conductive elements or traces 406, 407, which may lead to sense elements or other conditioning electronics for reading and writing of logic states to the EESDs 405. In some embodiments, the nonconductive substrates 401, 402 are silicon wafer materials or other nonconductive materials (e.g., plastics or ceramics). An address line or electrode 403 may connect to a conductive hole 408 in substrate 402 to make an electrical connection. An electrode 404 may connect to a conductive pad 409 via a wire bond 410. This assembly is known to those versed in the art of electronics fabrication. Multiple rows and columns of these conductive traces 406, 407 are then assembled in an additive fashion (stacked) onto the substrates 401, 402 to make a three-dimensional array of memory elements.

Figure 5:
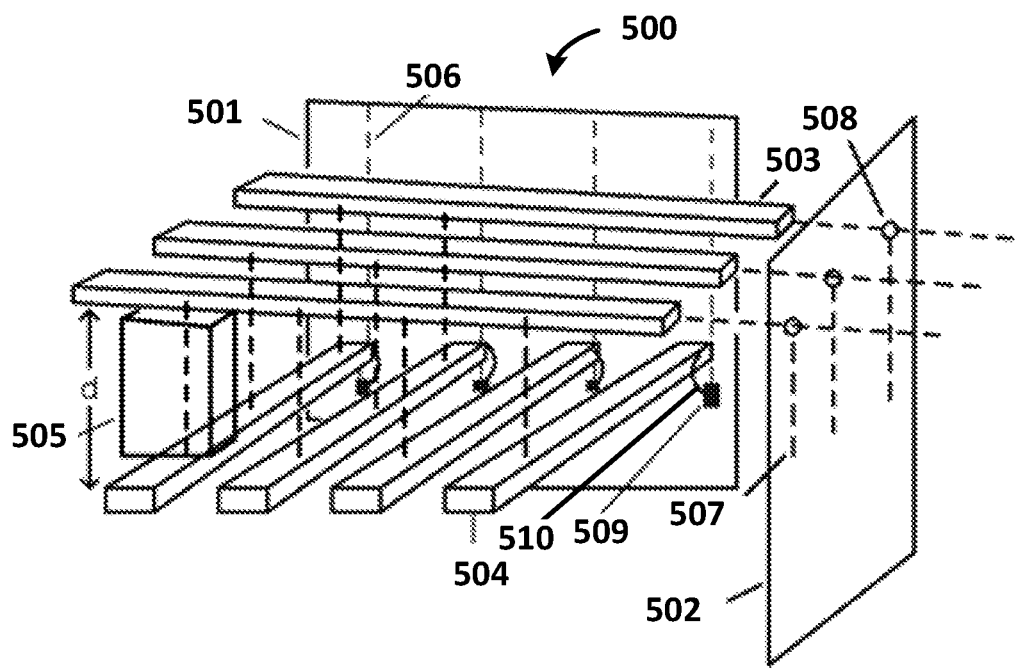
FIG. 5 is a perspective view of another exemplary arrangement of a single-layer capacitive grid connected to interconnection planes.

FIG. 5 is a perspective diagram of one embodiment of a single-layer capacitive grid 500 for a memory device comprising a plurality of EESDs 505 as disclosed herein. In FIG. 5, interconnections of the columns and rows of electrodes 503, 504 are through perpendicularly mounted connective planes 501, 502. Connections to the plane are through wire bonds 510 or conductive holes 508 in the planes 501, 502. Routing to the logic portions of the device can then be implemented though the conductive traces 506, 507. Conductive pads 509 and wire bonds 510 are shown.

Figure 6:
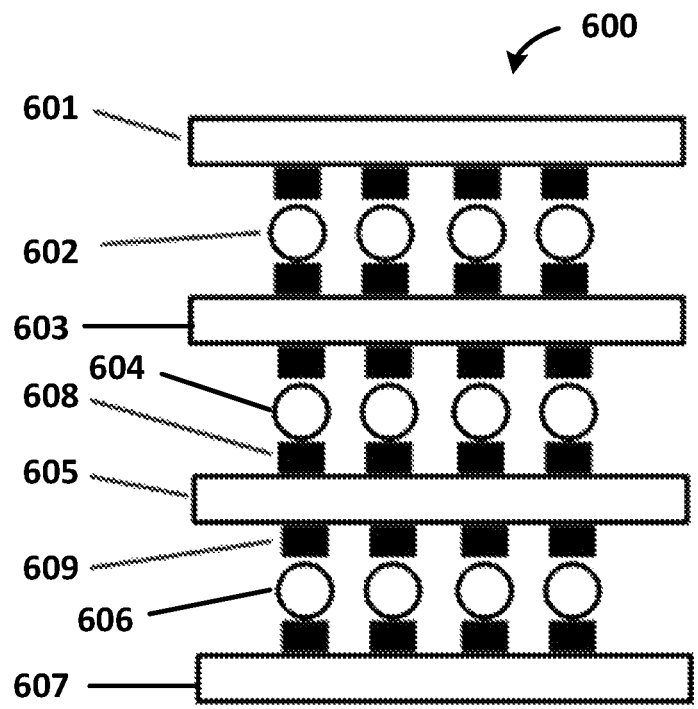
FIG. 6 is a side view of an exemplary multi-layer capacitive grid.

FIG. 6 is a side view of an exemplary multi-layer capacitive grid 600 for a memory device as disclosed herein. The lines or electrodes 601, 602, 603, 604, 605, 606, 607 may have any cross-sectional profile (e.g., square, rectangular, circular, ovoid) as is desirable from a performance and/or fabrication standpoint. EESDs, e.g., EESDs 608, 609 are located in gaps at intersections where rows and columns of lines or electrodes cross. In the embodiment of FIG. 6, there are two dielectric materials from two different EESDs in contact with a given line or electrode (i.e. electrode 605 is in contact with EESDs 608 and 609). Hence, two EESDs can be independently polarized at once from the activation of a single data line/electrode and address lines/electrodes in adjacent layers. For example, data line 605 can read or write to EESDs 608 and 609 using address lines 604 and 606. This allows for increased writing speed and a reduction in the number of electrodes necessary for the electrode grid. A single-layer capacitive grid has 2 layers of lines or electrodes. However, embodiments of a stacked, multi-layer capacitive grid have N layers of EESD and N+1 layers of electrodes. Thus, a considerable savings in material costs is realized and manufacture may be simplified. Such three-dimensional stacking is possible due to a lack of heat generated by the read/write process and greatly reduced needs for refresh cycles compared to memory devices with conventional capacitors and transistors.

Since no silicon vacuum deposition processes are necessary for the memory portion of the device, the memory cells can be manufactured in a non-vacuum environment. This further aids in their cost-effectiveness.

Because the voltage levels of the EESD capacitors can be accurately set during the charge cycle, it is possible that very low voltage level differences can be determined. The drive voltage of the sense or address line can be set to be an intermediate voltage prior to enabling the EESD on the sense line, thus maximizing the utility of the voltage level preset on the EESD to drive the line to a given voltage level. It is likely that the level of accuracy of the voltage line will be at least as good as a conventional capacitor driver, but able to work over much larger voltage range. In some embodiments, 0.05-0.5 V increments, such as 0.1-0.3 V or 0.25 V increments, in charge levels can be determined. In one embodiment, eight voltage levels can be determined with a single supply voltage. This allows $2^3$ possible states and each cell will thus take the place of three cells of binary voltage levels. With the possibility of reverse polarization, another 8 voltage levels can be read. Accordingly, in certain embodiments, it is possible that 16 states of voltage may be obtained from each cell of the memory device. Thus, each cell can be a 4-bit word (nibble). In some embodiments, an EESD as disclosed herein has from 2 to 4096 logic states, such as 2-2048 logic states, 2-1024 logic states, 2-512 logic stages, 2-256 logic states, 2-128 logic states, 2-64 logic states, 2-32 logic states, 2-16 logic states, or 2-8 logic states.

Embodiments of the disclosed EESDs have a volume of 0.00001-10000 $\mu m^3$, such as a volume of 0.00001-100 $\mu m^3$, 0.0001-100 $\mu m^3$, 0.001-100 $\mu m^3$, 0.01-100 $\mu m^3$, 0.05-100 $\mu m^3$, 0.1-100 $\mu m^3$, 0.1-50 $\mu m^3$, or 0.1-10 $\mu m^3$. In some embodiments, the EESD or cell has a capacitance of 5-1000 fF, 5-500 fF, or 50-500 fF. In one example, assuming a stack of EESDs that are approximately 2 µm square by 2 µm thick, a capacitance of more than 100 fF can be realized for each EESD. A 3 mm×3 mm square array might include 1500 electrodes per side of the array. Practically any number of arrays may be stacked. For the sake of example, assuming a single-layer capacitive grid, there would be 1500×1500 intersections, providing gaps for 2.25×10$^6$ EESDs. If each EESD has a capacitance of 100 fF, the total capacity of the array would be 2.25×10$^{-7}$ F or 0.225 µF.

Assuming the electrodes each measure 20 nm in thickness, then a total of 2040 nm of thickness is possible for an 8 $\mu m^3$ cell (linear dimensions of 2 µm×2 µm×2 µm). Assuming bipolar operation for a nibble (4 bits) per cell, the volume is an effective 2 $\mu m^3$ per bit. This is a density of 5×10$^{17}$ bit/$m^3$ or 500 Gb per $cm^3$.

Assuming a cell (EESD) volume of 8 $\mu m^3$ and 8 binary logic levels per cell, a volume of 1 $cm^3$ would include 1.25×10$^{11}$ cells or 125 Gcells/$cm^3$. With 8 binary logic levels per cell and 125 Gcells/$cm^3$, there would be 1×10$^{12}$ bits/$cm^3$ or 125 GB/$cm^3$.

In this way the capabilities of the memory device are extended by such an amount to make utilization of the method extend into very long-term storage of digital data. Applications such as these are termed non-volatile memory and can be thought to be "permanent" memory and data storage. In these cases, the reduced requirements for dynamic memory performance (such as speed of access) can allow for a smaller cell size. Using the prior example as a starting point, the cell can be reduced by a factor of 2× in linear dimensions (i.e., a cell with a volume of 1 $\mu m^3$) to give an 8× increase in the density of the memory device. So, a ROM device constructed as noted above would have 500 Gb/cm$^3$×8=500 GB/cm$^3$ (bipolar mode). The associated electronics are assumed to be able to determine the permittivity of the cell to a resolution of $\frac{1}{8}^{th}$ the voltage span of the cell (3 bit). Further reduction of the cell size to a linear length of 500 nm provides an 8× increase to 4.0 TB/cm$^3$. In unipolar mode, a 1 μm$^3$ cell with eight voltage levels would have a density of 1 TB/cm$^3$ (8 Tb/cm$^3$). If the dimensions could be reduced to 0.029 μm (the size of a common DRAM), a density of 41,000 TB/cm$^3$ could be attained.

Table 1 provides exemplary dimensions and properties for a "nominal" cell having linear dimensions of 1 μm, a larger electromagnetic pulse (EMP)-resistant cell, a very large "energy collector and memory cell," and a cell with maximum memory density. For robustness, the EMP-resistant cell is assumed to have only 2 logic levels per cell.

TABLE 1

| | Nominal | EMP-Resistant | Energy Collector and Memory | Maximum Memory Density |
|---|---|---|---|---|
| Linear dimension (μm) | 1 | 2.5 | 20 | 0.029 |
| Cell area (μm$^2$) | 1 | 6.25 | 400 | 0.000841 |
| Electrode thickness (μm) | 0.05 | 0.1 | 0.1 | 0.02 |
| Spacing between electrodes (μm) | 1 | 2.5 | 5 | 0.029 |
| Insulation thickness (μm) | 1 | 2 | 1 | 0.2 |
| Vertical cell thickness (μm) | 3.05 | 7.1 | 26.1 | 0.278 |
| Number of layers per cm | 3,279 | 1,408 | 383 | 35,971 |
| Unit volume (μm$^3$) | 3.05 | 44.4 | 14,400 | 0.000234 |
| Cells per layer per cm$^2$ | 1.0 × 10$^8$ | 1.6 × 10$^7$ | 2.5 × 10$^5$ | 1.2 × 10$^{11}$ |
| Number of cells in 1 cm$^3$ | 3.3 × 10$^{11}$ | 2.2 × 10$^{10}$ | 9.6 × 10$^7$ | 4.3 × 10$^{15}$ |
| Logic levels per cell | 8 | 2 | 4096 | 2 |
| Bytes per cm$^3$ (Mb) | 2.6 × 10$^6$ | 4.5 × 10$^4$ | 3.9 × 10$^5$ | 8.6 × 10$^9$ |
| Bytes per cm$^3$ (MB) | 3.3 × 10$^5$ | 5.6 × 10$^3$ | 4.9 × 10$^4$ | 1.1 × 10$^6$ |
| Bytes per cm$^3$ (TB) | 0.33 | 0.01 | 0.05 | 1070 |

In some embodiments, the EESD has a density within a range of 1 bit to 1024 TB per cm$^3$, such as a density of 0.008 kb-1024 TB per cm$^3$, 0.01 kb to 1024 TB per cm$^3$, 5 kb-512 TB per cm$^3$, 100 kb-124 TB per cm$^3$, 100 kb-16 TB per cm$^3$, 1 Mb-16 TB per cm$^3$, 100 Mb to 16 TB per cm$^3$, 1 Gb to 16 Tb per cm$^3$, 50 Gb to 16 TB per cm$^3$, 500 Gb to 16 TB per cm$^3$, or 500 Gb to 8 TB per cm$^3$.

Figure 7:
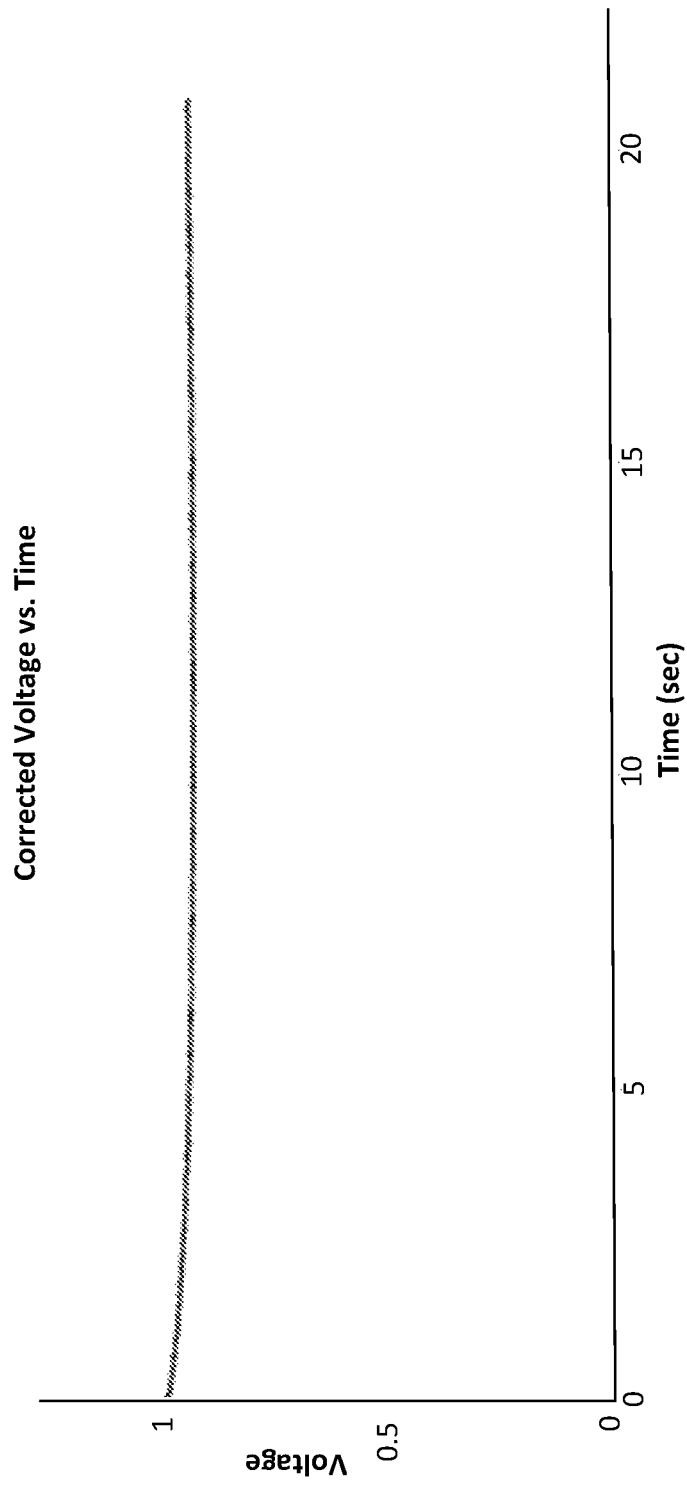
FIG. 7 is a graph of corrected voltage vs. time illustrating a low rate of self-discharge of an electroentropic storage device as disclosed herein. The EESD was charged to 1 V, disconnected at time 0, and the voltage across the EESD ($V_C$) was measured for 20 seconds.

Embodiments of the EESDs comprising a dielectric material as disclosed herein have a very low rate of self-discharge. In one example, an EESD with a thickness of 5 μm exhibited little or no self-discharge over a period of 20 seconds (FIG. 7). With respect to the graph shown in FIG. 7, the voltage at the EESD's electrode was corrected for the load of the oscilloscope probe (×100). Without wishing to be bound by a particular theory, it is believed that the slight curve in the first few seconds was either due to inaccuracy in the correction factor or hysteresis.

III. Dielectric Materials for Electroentropic Storage Devices (EESDs)

In the prior art it has been assumed that the energy stored in variously named layers adjacent to the electrodes of a capacitor is non-recoverable. In other words, when an electric potential is applied to a flat electrode in contact with a solution that has ions capable of movement through the solution, a movement of ions to that surface takes place. Once near enough to the electrode, the ions are assumed to be immobilized at the surface due to the strong electrostatic forces that bind them in place. The energy of collisions with solvent molecules is not sufficient to displace these ions. If the electric potential is removed from the surface, these ions are free to move about in a diffusive manner. It is interesting to note that if the electric potential is removed from the electrode surface, the resulting collapse of the electrical bilayer closest to the electrode allows the release of energy of the immobilized ions such that the energy is not fully released as heat, but instead the electrode can absorb the energy produced by the collapsing electrical field and produce an electric potential and current in that conductor. This effect is the basis for the energy storage in an electrical double layer capacitor (EDLC).

The energy that is stored in the diffuse outer layers of an EDLC is often not fully recovered. The electrical double layers that are formed close to the electrode surface are termed Helmholtz layers, while those that are further away are termed the Gouy-Chapman layers. One distinction between these layers is that the ionic layers that are not capable of being thermally diffused from the electrical surface are termed "Helmholtz" layers. These layers are essentially immobilized at the working temperature by the application of an electric potential to the surface. Another distinction is that the diffuse Helmholtz layers (Gouy-Chapman, but often referred to as Diffuse Helmholtz layers), referred to as DH layers herein, are layers wherein random thermal movements are able to diffuse the ionic arrangements induced by the electric field. Since this is not a sharp boundary, an arbitrary time unit associated with a 50% loss of potential energy over a period of one second could be used to define the boundary layer conditions between the two major macroscopic layers.

Both the Helmholtz and DH layers (which form at constant ambient temperature) are entropically reduced as compared to the bulk. These entropically modified materials display different physical characteristics that have been noted (e.g. permittivity). Application of the modified characteristics has been shown, for example, in U.S. Pat. No. 8,633,289, which describes improved synthesis of the stable intermediate dimer of xylylene ([2,2']paracyclophane) and derivatives related to that compound and general structure, a method for the formation of cyclophanes and related compounds with various substituents, and a method to apply the xylylene (or substituted xylylene) monomers to make coatings and other polymer products derived from the reactive intermediate. Likewise, U.S. Pat. No. 9,011,627 describes, inter alia, a method for making high permittivity dielectric material for capacitors using organic polymers to produce low conductivity dielectric coatings.

The rationale for enhanced permittivity in entropically reduced dielectric materials is understood by the concept of the charges being "organized" into discrete rows and columns. Since each charge layer is energetically optimized to be in the lowest energy configuration possible based upon surrounding ionic charges, imposition of an external electric field from the electrodes leads to disruption of the lowest energy state of an ion or dipole attainable from its current position in the dielectric material layer. Thus, when the electric field is applied, the dipole or ion is moved from its rest position (i.e., its position before the electric field is applied), which in turn leads to a rearrangement of the charge distribution in the material. This leads to other rearrangements of all other dipoles continuing throughout the dielectric material. Energy that is not converted into heat is absorbed by the dielectric material. When the energy is released, a reverse of this process can take place provided the energy stored is not released through other mechanisms such as increased thermal motions (random molecular motion, which is proportional to temperature). Dielectric materials that act in this manner are referred to as "entropic" materials since application of an external electric field induces changes in entropy within the dielectric material.

In the case of entropically "normal" materials, the rearrangement of the dipoles and ions in an electric field is not as certain to cause a rearrangement of all the other ions and dipoles in the materials. In other words, there is a probability that the rearrangement of the dipole or the ion can take place with little or no net interaction with the other dipoles and ions in the material. In these cases, the material will display less energy storage capability than in its entropically reduced form.

If the viscosity of the material is such that movement of the molecules is able to take place, the energy stored from the polarization of the dipole or ionic layer is able to dissipate through relaxation mechanisms in which the energy is converted into rotation, vibration, translation, and other movements that manifest themselves externally as heat. With a low viscosity material, the energy that has been stored in the Diffuse Helmholtz layers (DH layers) is thus lost due to random motions of the ions and dipoles.

With intermediate to high viscosity materials, the time frame for formation of the Helmholtz layers (H layers) and the DH layers is substantially increased. The thermal motions of molecules (excluding for now vibrations of the lattice as a macroscopic phenomenon), however, are effectively reduced to near negligibility. In these materials, it is possible to store the energy of an electric field in the H and DH layers relatively quickly compared to the time required for the energy to be dissipated thermally. Thermal dissipation is essentially a first order decaying exponential in time similar to radioactive decay or diffusion; if during the charging cycle the energy is absorbed over a time period of, for example, 1 second, a high viscosity material may require many seconds or even minutes to reach even 90% energy dissipation as heat.

The thermal decay process is substantially slower than the electrical double layer energy storage process. Thus, it is possible to utilize the energy stored by the formation of both the H and DH layers if the energy is quickly accessed. In this situation the release of most of the energy in the formed dipole and ionic layers is through the electric field and is subsequently coupled with electric potential and current. Since the discharge of the H and DH layers may require the movement of molecules and atoms, the discharge process can be relatively slow compared to charging but still remain fast relative to the relaxation mechanisms that produce heat.

Embodiments of the disclosed EESDs comprise a dielectric material having a relative permittivity greater than silicon dioxide, i.e., greater than 3.9. In some embodiments, the dielectric material has liquid characteristics, and has a viscosity similar to honey or greater. In certain embodiments, the dielectric material has a viscosity from 10,000 cP to 250,000 cP. In an independent embodiment, the dielectric material is a solid.

The dielectric material may be substantially free of conductivity; in other words, the dielectric material does not undergo oxidation/reduction at or near either electrode and does not exhibit Ohmic conductivity. In other embodiments, the dielectric material is conductive. The dielectric material may comprise a conductive or nonconductive polymer, an inorganic metal oxide, mixed metal oxides, mixed polymer and organic materials, or combinations thereof. In some examples, the polymer is a biopolymer.

In some embodiments, the dielectric material comprises polymeric molecules having polar and/or ionizable functional groups, resulting in intramolecular dipoles and dipole moments. The polymeric molecules may further include one or more double bonds. In some embodiments, the polymeric molecules are polar polymers. Proteins are readily available, inexpensive polar polymers that have low toxicity. The low toxicity is a large advantage over other polymers, and allows the EESDs to be recycled or incinerated. A protein molecule includes amino acids with polar and/or ionizable functional groups. Other suitable polymers include, but are not limited to, substituted (e.g., fluorinated) and unsubstituted parylene polymers, acrylic acid polymers, methacrylic polymers, polyethylene glycol, urethane polymers, epoxy polymers, silicone polymers, organic terpenoid polymers, natural organic polymers (e.g., resins such as shellac), polyisocyanates, and combinations thereof. Copolymers, such as acrylate copolymers (e.g., copolymers with ethylene butyl-, ethyl-, and methyl-acrylates) and parylene copolymers (e.g., copolymers of p-xylylene with acrylates (e.g., 2-carboxylethyl acrylate), methacrylates (e.g., 3-(trimethoxysilyl)propyl methacrylate), α-pinene, R-(−)carvone, linalool, cyclohexene, dipentene, α-terpinene, R-(+)-limonene, and combinations thereof), also are within the scope of this disclosure. Non-limiting examples of polar polymers include zein, hemp protein, wheat gluten, poly(acrylic acid-co-maleic acid), poly(acrylic acid), whey protein isolate, soy protein isolate, pea protein extract, shellac, and combinations thereof.

In certain embodiments, polymeric molecules are derivatized to attach additional functional groups, such as functional groups that facilitate subsequent binding of the polymeric molecules to a bare electrode surface (i.e., a bare metal or carbon surface) or to a composite electrode surface. Exemplary derivatization agents include, but are not limited to, anhydrides, carbodiimides, imidoesters, and reagents including combinations of N-hydroxysuccinimide and maleimide, aryl azide, or diazirine groups. In some examples, the polymer is derivatized with an anhydride, such as maleic anhydride, itaconic anhydride, cis-4-cyclohexene-1,2-dicarboxylic anhydride, or cis-5-norbornene-end-2,3-dicarboxylic anhydride. A derivatized polymeric molecule can be bound to the electrode surface by crosslinking or by other reaction with the surface. When a polymeric molecule is derivatized with maleic anhydride, for example, the derivatized polymeric molecule can be crosslinked through the double bonds. Crosslinking can be performed by any suitable means, such as a chemical agent (e.g., a radical initiator), ultraviolet light activation, or thermal activation. Two non-limiting examples of nonconductive, high-permittivity dielectrics are zein in a shellac matrix and a protein derivatized with maleic anhydride.

The inventors surprisingly discovered that polymeric molecules with the above-described characteristics, when sterically constrained, can be used for energy storage even though the polymeric molecules cannot freely move between opposing electrodes. Polymeric molecules can be sterically constrained by binding the polymeric molecules to a bare electrode surface or to a nonconductive or insulative coating of a composite electrode by any means, including a covalent bond (single or multiple), van der Waals forces, or hydrogen bonding, prior to charging and/or discharging an energy storage device including the electrode and a dielectric material comprising the polymeric molecules.

Without wishing to be bound by any particular theory of operation, it is believed that within a large molecule, movements of only portions of the molecule may take place while other portions of the molecule are bound in place sufficiently to prevent the overall movement to a lower energy level and subsequent release of potential energy to be coupled to the electrode and not released as thermal motion. This constraint of movement decreases the degrees of freedom in the dielectric molecule, and consequently decreases the molecule's ability to dissipate absorbed energy from the electrical field as heat. Thus, a bound polymeric molecule couples to the electric field in such a way that the polymeric molecule cannot release energy in the form of heat due its reduced degrees of freedom. The movement of certain portions of a macromolecule can be related and is similar to electrophoretic movements known to those who use such techniques to analyze biological macromolecules.

Without wishing to be bound by any particular theory of operation, it is believed that when a portion of the polymer is bound to an electrode (or to a coating on the electrode), the remainder of the polymer may stretch, twist, or bend within the dielectric film as polar and/or ionizable functional groups reorient in response to an electric field. These changes in conformation and position store energy within the energy storage device. When the energy storage device discharges, the stored energy is released as electrical energy as the bound polymer molecules return to a less ordered conformation. A dielectric material comprising polymeric molecules, wherein at least some of the polymeric molecules have decreased degrees of freedom, is referred to as a "sterically constrained" dielectric material.

In some embodiments, the dielectric material comprises an organic polymer and a high permittivity compound, such as an inorganic salt. The dielectric material may further include a solvent. Suitable polymers include, but are not limited to, zein, shellac, and silicone oil. In one embodiment, the inorganic salt is a boron compound, such as sodium borohydride or borax. When the inorganic salt is sodium borohydride or borax, the dielectric material may further comprise ammonium hydroxide. In an independent embodiment, the inorganic salt is barium titanate. In another independent embodiment, the inorganic salt is a transition metal salt, such as a Gd, Sr, Sn, and/or Fe salt. The salt may be, for example, a carbonate salt. When the inorganic salt is barium titanate or a transition metal salt, the dielectric material may further comprise sodium borohydride or borax. In certain embodiments, the dielectric material further comprises a permittivity increasing material or breakdown voltage adjuvant. The permittivity increasing material or breakdown voltage adjuvant may include Y, Ni, Sm, Sc, Tb, Yb, La, Te, Ti, Zr, Ge, Mg, Pb, Hf, Cu, Ta, Nb, Bi, or a combination thereof, which is substantially evenly distributed throughout the material.

Additional disclosure regarding suitable dielectric materials is found, e.g., in U.S. Pat. No. 8,432,663, U.S. Pat. No. 8,940,850, U.S. Pat. No. 9,011,627, US 2015/0000090A1, US 2015/0000833 A1, and US 2015/0131198 A1, each of which is incorporated in its entirety herein by reference.

IV. Methods of Making an Electroentropic Memory Device

There are many ways to make embodiments of an electroentropic memory device as disclosed herein. As understood by one of ordinary skill in the art of making memory devices, a preferred route of manufacture may be selected based at least in part on considerations of performance versus cost.

One exemplary method of making an electroentropic memory device is described below.

1) A substrate for manufacture is chosen. Suitable materials include, but are not limited to, a plastic material or other nonconductive surface such as silicon dioxide.
2) One plane of the substrate is patterned with a photoresistive material such that a multitude of parallel flat facing strips are aligned.
3) The entire surface is then metallized.
4) The photoresist is removed (dissolved or etched off) leaving a pattern of parallel conductive strips. In some embodiments, the spacing between the strips is typically 0.05 µm and the strips themselves are 50 nm to 50 µm in width.
5) An optional photoresistive material that is capable of being dissolved is deposited on the metal parallel strips to make a flat surface with a typical thickness of 50 to 20,000 nm.
6) The surface is then metallized to make a pattern of parallel conductive strips that are aligned perpendicular to the first conductive strips.
7) The photoresistive material is subsequently removed from the interstitial spaces to provide gaps at intersections of the two sets of crossing metallized parallel stripes.
8) As an optional step, the metal three-dimensional grid may be electrically insulated by exposure to vapors of p-xylylene to form a Puralene® polymer (poly-p-xylylene) coating, or other alternative coatings. In some embodiments, pretreatment of the grid with self-assembling molecules is performed to reduce leakage. Use of a self-assembled monolayer (SAMs) by itself, or as a precursor treatment to the application of poly-p-xylylene is known to those versed in the art of parylene coatings (vacuum depositions). Exemplary self-assembled monolayers can be prepared from triethoxyvinylsilane, 3-(trimethoxysilyl) propyl methacrylate, or hexadecyltrimethoxysilane.
9) An amount of dielectric material is placed in the intersection gaps produced by removal of the photoresistive material.

In another exemplary method, the optional photoresist at step (5) of the above method is not used. Instead, a second set of parallel conductive strips may be made by any other suitable method and then placed onto the first conductive strips to make a completed assembly. In some embodiments, amounts of a dielectric material are placed at the anticipated intersections to form the EESDs and the second set of parallel conductive strips is then placed on top of the dielectric material. The dielectric material serves as the spacer when the second set of strips is added. In an independent embodiment, a patterned insulative layer is applied to prevent the first and second sets of parallel conductive strips from contacting one another.

Methods for forming a Puralene® polymer (poly-p-xylylene) coating and similar coatings are further described in U.S. Pat. No. 8,633,289 and US 2015/0017342 A1, each of which is incorporated in its entirety herein by reference.

IV. Methods of Using an Electroentropic Memory Device

In one embodiment, the electroentropic memory device is used without a recharge cycle. During the writing of a voltage level to a particular memory cell, the impression of the electric field onto the dielectric of the EESD induces a change in the permittivity of the dielectric material. This change in electrical permittivity is a function of voltage. As a result, the device as a whole will function as a memory storage device even without the necessity of accurate voltage levels. If the voltage level of a particular cell is allowed to dissipate (this may be a very long time, e.g., >3 seconds), the permittivity of the dielectric material can still be determined by utilization of a "pulse" of columbic charge. If the dielectric was charged to a given level of voltage, even if the charge at the electrodes (i.e., the select and data line connected to the EESD) is drained, the permittivity of the dielectric remains at a level that is consistent with the voltage (E-field) the dielectric would have had if the E-field were still present. This hysteresis characteristic of the dielectric is advantageous to determine the voltage level change in the memory cell upon a small pulse of amperage to a given cell. This columbic pulse will then induce a small change in the residual voltage that is proportional to the permittivity of the dielectric, which is directly proportional to the capacitance of the EESD as set forth below.

The general relation between charge Q, capacitance C, and potential V is:

$$Q = C \times V \qquad \text{Equation 1}$$

The capacitance C is typically considered a constant physical property under most conditions. The capacitance of a specific EESD in the array can be measured by giving it a very small perturbing charge. In an EESD, the application of an electric potential (or field) can affect the relative permittivity of the dielectric. Given that this effect is largely a function of the voltage (polarization of the dielectric), this property can be used to determine the state of the capacitor without a very accurate measurement of the voltage. The perturbing charge should not be enough to effect a capacitance change in the capacitor regardless of its state of polarization. Given this condition, when there is a change in the charge, dQ on the electrodes of the capacitor, this becomes:

$$Q + dQ = C \times V' \qquad \text{Equation 2}$$

where V' is the new potential across the capacitor. By subtracting Equation 1 from Equation 2, capacitance C can be determined as a function of the changes in charge and potential.

$$Q + dQ - Q = CV' - CV \qquad \text{Equation 3}$$

$$dQ = C \times (V' - V) \qquad \text{Equation 4}$$

$$\frac{dQ}{dV} = C \qquad \text{Equation 5}$$

The value of the EESD's capacitance C is compared to predetermined values for charged and uncharged states of the EESD, and the logic state is thus correlated to the capacitance rather than to a voltage appearing at the electrodes.

In the relationship, $C = K^* e_0 ^* A/d$ where A is the area of one of the electrodes in contact with the dielectric material, d is the distance between the electrodes (i.e., between the address line and the data line), and $e_0$ is the electrical permittivity of a vacuum ($8.8542 \times 10^{-12}$ F/m), all quantities are constant except for K, relative permittivity. Thus, voltage is related to the change in capacitance of a given EESD.

The total polarization of the dielectric is dependent upon at least three different mechanisms of energy storage (as defined by curve fitting to a charging curve). The fastest mechanisms for energy storage (charging) are affected by the state of polarization of the longest-term energy storage mechanism. Thus, as the longest-term energy polarization takes place, a measurement of the faster mechanisms of polarization indicate significant changes. Changes in this fast short-term polarization can be used to determine what the underlying longer-term polarization may be.

The original polarization level of the EESD cell is determined by the measurement of the capacitance of the EESD. A calibration curve of the capacitance of an EESD to the polarization is used to calculate the original programmed polarization. Methods to do this calculation can be as simple as a look-up table, analog voltage reference levels, or mathematical calculations in a logic device as is well known.

In this way the length of time allowed to elapse between refreshment charges to the EESD is greatly extended or practically eliminated altogether. Advantageously, the quantity of charge that is used to determine capacitance should be as practically small as possible for a given noise level of the electronic switching. Methods for the movement of minute charge levels are known to those versed in the art of analog electronics. Determination of the original polarization state of the dielectric can be significantly altered by the application of too much charge for an extended period of time; so, the smallest amount of charge applied singly or in multiple applications generally is used.

In this way the capabilities of the memory device are extended by such an amount to make utilization of the method extend into very long-term storage of digital data. Applications such as these are termed non-volatile memory and can be thought to be "permanent" memory and data storage. In these cases, the reduced requirements for dynamic memory performance (such as speed of access) can allow for a smaller cell (EESD) size. Using the prior example as a starting point, the cell can be reduced by a factor of 2× in linear dimensions to give an 8× increase in the density of the memory device. Thus, an electroentropic memory device constructed as shown in FIG. 2 would have 500 Gb/cm³×8=500 GB/cm³. The associated electronics are assumed to be able to determine the permittivity of the cell to a resolution of $\frac{1}{8}^{th}$ the voltage span of the cell (3 bit). Further reduction of the cell size to 500 nm linear length gives an 8× increase to 4.0 TB/cm³.

Since embodiments of the disclosed dielectric materials are often not conductive enough to substantially discharge the cross connected parallel EESDs, the need for an insulative isolation layer between cells in the same plane is small while the device is being actively used. However, in the case of longer-term memory storage, there could be some advantages to an isolation barrier between cells in the same plane. Methods for forming an isolation barrier are well known to those versed in the art of micro- and non-structured layers.

Figure 8:
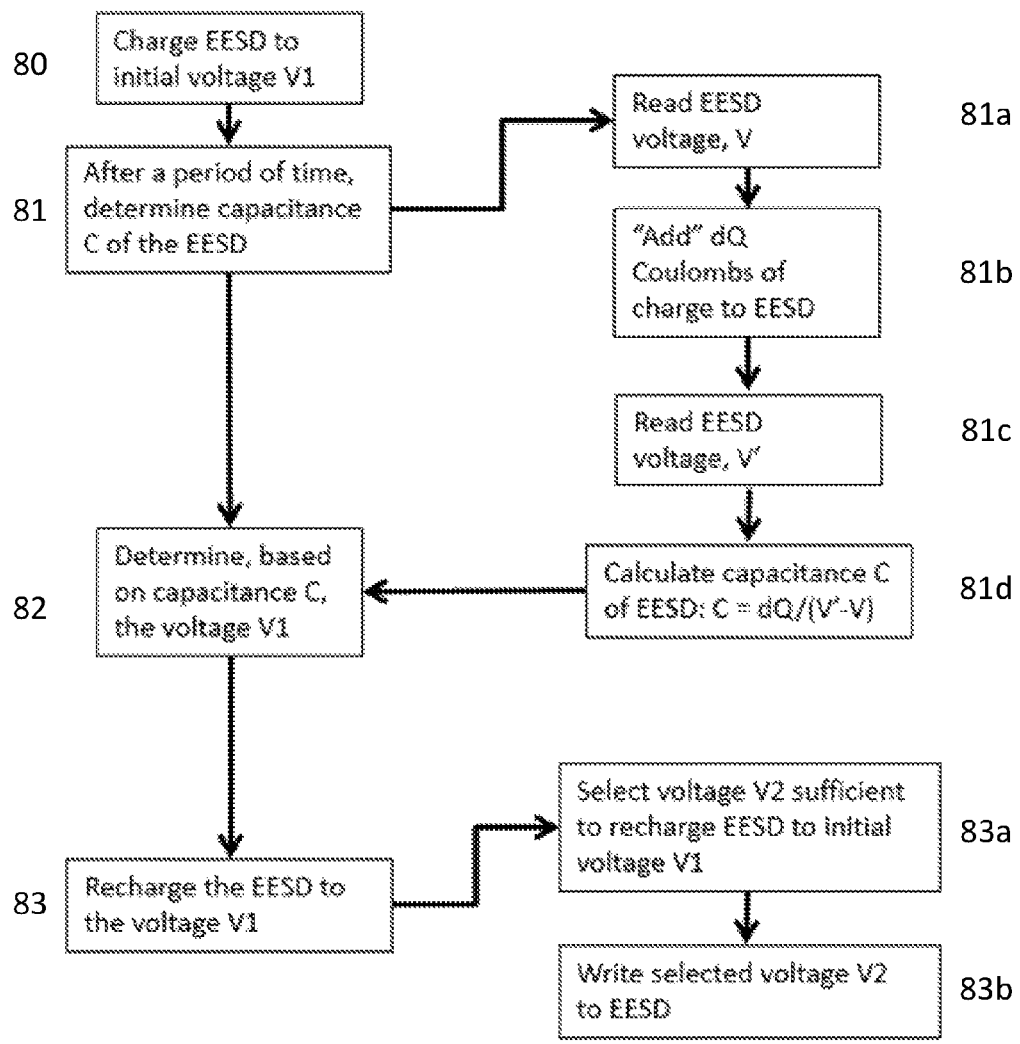
FIG. 8 is a flow diagram illustrating one method of determining the capacitance of an EESD in an electroentropic memory device and refreshing the memory device.

FIG. 8 is a flow diagram illustrating an exemplary method of determining the capacitance of an EESD in an electroentropic memory device comprising an array of EESDs as disclosed herein, and refreshing the memory device. In step 80, an EESD is initially charged to a voltage V1. After a period of time has elapsed, the capacitance C of the EESD is determined in step 81. Determining the capacitance C may include reading the voltage V of the EESD (step 81a), adding a perturbing charge dQ to the EESD (step 81b), reading the subsequent voltage V' of the EESD (step 81c), and calculating the capacitance C of the EESD according to Equation 5 (step 81d). In some embodiments, the perturbing charge dQ has a magnitude approximately equal to a magnitude of discharge due to leakage over time. The magnitude of discharge may be from 0.1-50% of a charge capacity of the EESD, such as from 1-50%, 1-25%, 1-10%, or 1-5% of the charge capacity. In certain embodiments, the perturbing charge dQ has a magnitude within a range of $1\times10^{-15}$ coulombs to $1\times10^{-2}$ coulombs, such as a magnitude from $1\times10^{-15}$ coulombs to $1\times10^{-6}$ coulombs, from $1\times10^{-12}$ coulombs to $1\times10^{-6}$ coulombs, or from $1\times10^{-12}$ coulombs to $1\times10^{-10}$ coulombs. At step 82, the initial voltage V1 of the EESD is determined based on the capacitance C. Determining V1 may be done by comparing capacitance C to predetermined values corresponding to states of charge and discharge of the EESD. At step 83, the EESD is recharged to the initial voltage V1. Recharging the EESD may be performed by selecting a voltage V2 sufficient to recharge the EESD to the initial voltage V1 (step 83a) and then writing the selected voltage V2 to the EEDS (step 83b).

Figure 9:
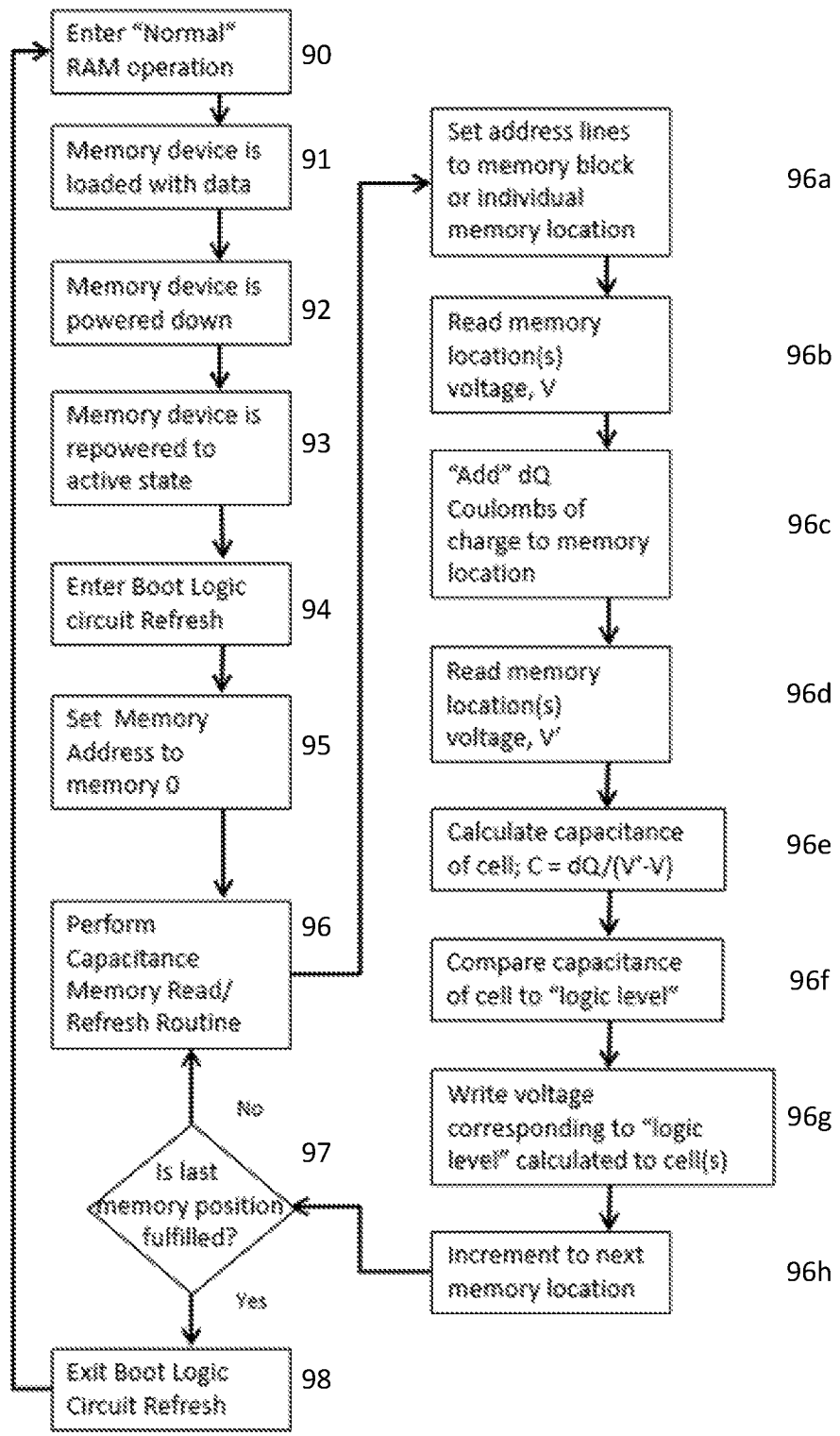
FIG. 9 is a flow diagram illustrating one method of reading an electroentropic memory device in ROM mode.

FIG. 9 is a flow diagram illustrating one method of reading an electroentropic memory device as disclosed herein in ROM mode. Upon entering RAM operation (step 90), the memory device is loaded with data (step 91). The memory device is subsequently powered down (step 92). At step 93, the memory device is repowered to an active state. The memory device then enters a boot logic circuit refresh (step 94). The memory address is set to memory 0 (step 95), and a capacitance memory read/refresh routine is initiated (step 96). In the memory read/refresh routine, address lines are set to a memory block or individual memory location (step 96a), and the voltage V of the memory location(s) is read (step 96b). A perturbing charge dQ is added to the memory location (step 96c), and the voltage V' is read (step 96d). The capacitance of the EESD cell is calculated according to Equation 5 (step 96e). The capacitance is compared to a logic level (step 96f). Applying a voltage to an EESD modifies the intrinsic capacitance of the EESD's dielectric material. Incremental voltages (e.g., voltages in increments of 0.25 V) may be used to modify the intrinsic capacitance in increments, wherein each incremental capacitance corresponds to a logic level of the EESD. The intrinsic capacitance remains unchanged when the applied voltage is removed. Thus, the capacitance is indicative of the originally applied voltage. The comparison may be performed, for example, using a look-up table which relates capacitance to initial voltage V. A voltage sufficient to restore the EESD voltage back to the initial value V associated with the logic level is selected and written to the EESD cell (step 96g). The routine then is incremented to the next memory location (step 96h). At step 97, a query asks whether the last memory position has been fulfilled. If the answer is no, the memory read/refresh routine is repeated. If the answer is yes, the boot logic circuit refresh is exited at step 98.

Figure 10:
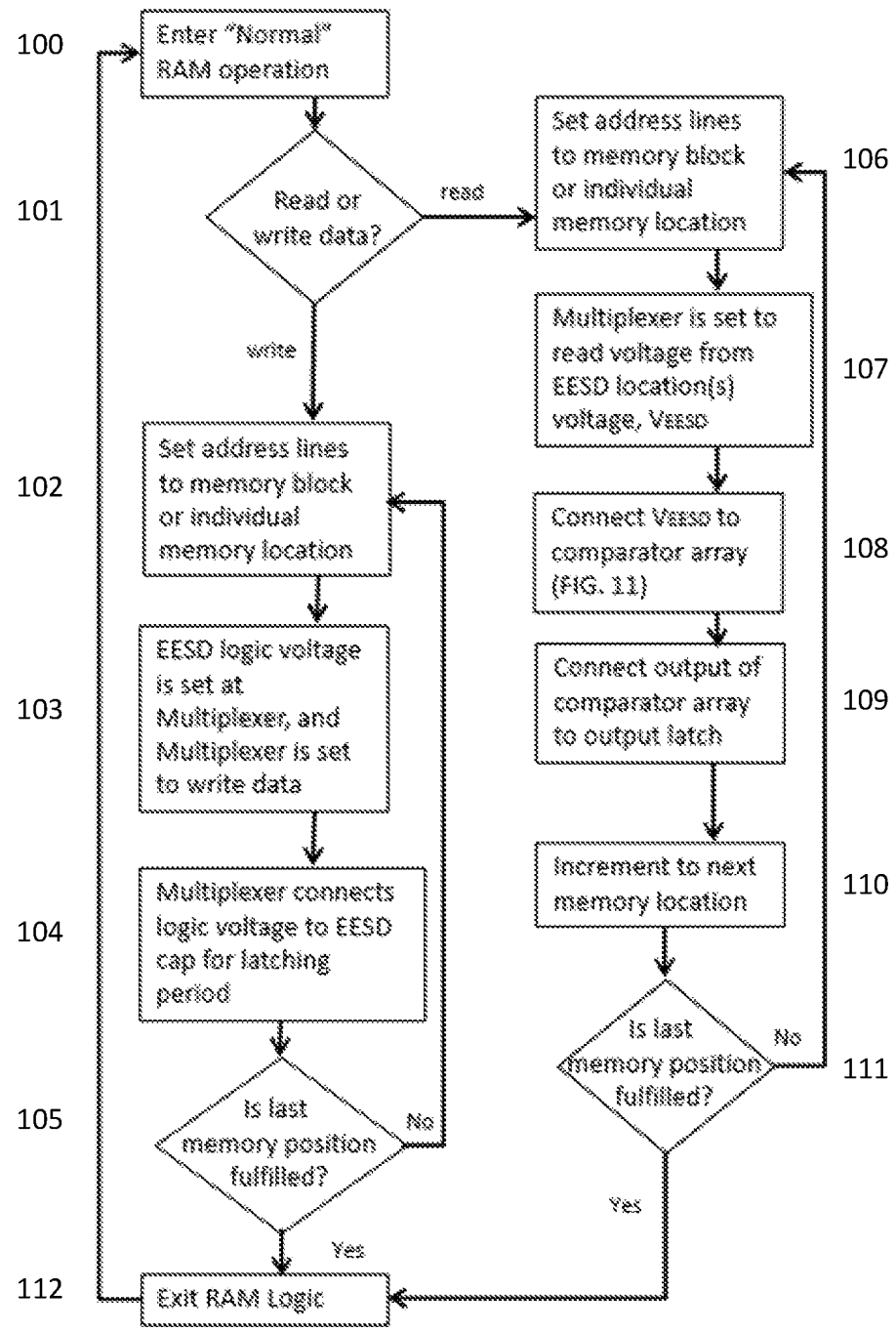
FIG. 10 is a flow diagram illustrating one method of reading and writing to an electroentropic memory device in RAM mode.

FIG. 10 is a flow diagram illustrating one method of reading and writing to an electroentropic memory device in RAM mode. Normal RAM operation is entered at step 100. At step 101, a query asks whether to read or write data. To write data, the device enters a voltage memory write routine and address lines are set to a memory block or individual memory location at step 102. A logic voltage for one or more EESDs is set at a multiplexer and the multiplexer is set to write data (step 103). The multiplexer connects the logic voltage to the EESD(s) for a latching period (step 104). At step 105, a query asks whether the last memory position is fulfilled. If the answer is no, the voltage memory write routine (steps 102-104) are repeated. If the answer is yes, RAM logic is exited at step 112. If the response at step 101 is to read data, the device enters a voltage memory read routine, and address lines are set to a memory block or individual memory location at step 106. The multiplexer is set to read the voltage $V_{EESD}$ at one or more EESD locations (step 107). The voltage $V_{EESD}$ is connected to a comparator array (see, e.g., FIG. 11) at step 108. An output of the comparator array is connected to an output latch (step 109). The routine is then incremented to the next memory location (step 110). At step 111, a query asks whether the last memory position is fulfilled. If the answer is no, the voltage memory read routine (steps 106-110) are repeated. If the answer is yes, RAM logic is exited at step 112.

Figure 11:
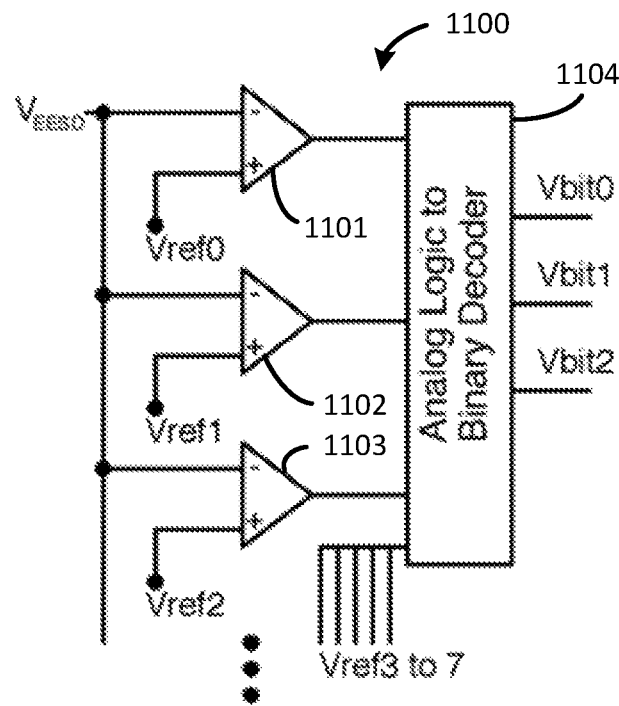
FIG. 11 is a schematic diagram of a comparator array useful for determining a logic state or level of an EESD.

FIG. 11 shows one embodiment of a comparator array 1100 used in the voltage memory read routine. The EESD voltage $V_{EESD}$ is connected to the comparator array 1100, which comprises a plurality of comparators 1101, 1102, 1103, etc. Each comparator compares $V_{EESD}$ to a reference voltage, e.g., $V_{ref0}$, $V_{ref1}$, $V_{ref2}$, etc. Each comparator outputs a signal indicating whether $V_{EESD}$ is greater than or less than the reference voltage. An analog logic to binary decoder 1106 converts the signals received from the comparator to bits, e.g., Vbit0, Vbit1, Vbit2, thereby providing 3 bits of binary indicating a voltage and therefore a corresponding logic level for the EESD.

Figure 12:
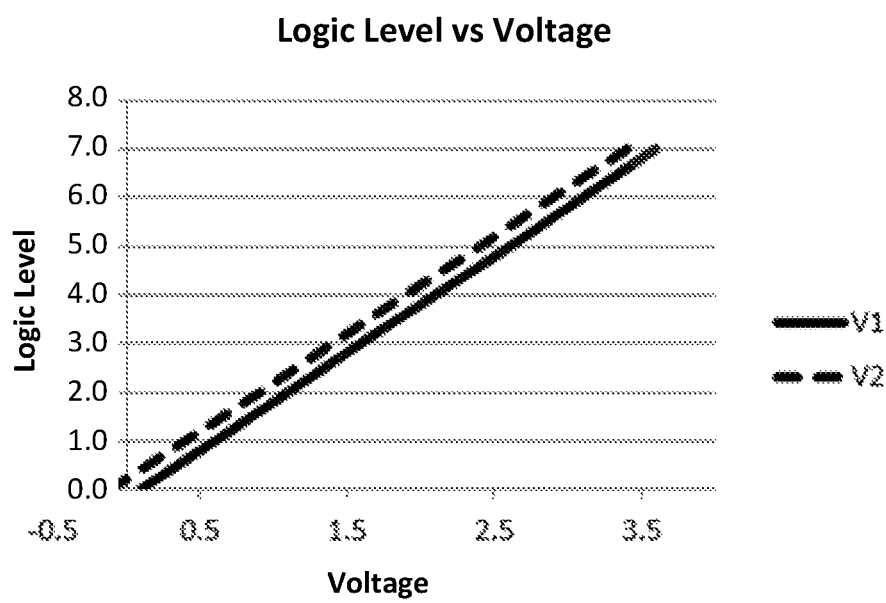
FIG. 12 is a graph of logic level versus voltage, illustrating the relationship between $V_{EESD}$ and the logic level of an EESD for an embodiment wherein the EESD has 8 logic levels.

FIG. 12 is an exemplary graph of logic level versus voltage, illustrating the relationship between $V_{EESD}$ and the logic level of an EESD for an embodiment wherein the EESD has 8 logic levels. In the example shown in FIG. 12, the logic levels correspond to voltage increments of 0.5 V applied to the EESD. For instance, an EESD with a voltage of 1.5 V is at a logic level 3. The graph further shows that a slight decrease in voltage of the EESD (i.e., from V1 to V2) due to leakage is sufficiently insignificant that the logic level is still accurately determined.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope and spirit of these claims.

We claim:
1. A memory device, comprising:
   an array of electroentropic storage devices (EESDs), each EESD comprising a dielectric material having a relative permittivity greater than 3.9, wherein each EESD is a storage element in the memory device;
   a plurality of address lines arranged in rows to select a row of the EESDs; and
   a plurality of data lines arranged in columns to select a column of the EESDs, wherein each EESD is coupled in series between an address line connected to one side of the EESD and a data line connected to an opposing side of the EESD.

2. The memory device of claim 1, wherein there is a spatial separation at each intersection where a data line crosses an address line, and each of the spatial separations is occupied by an EESD coupled in series between the address line and the data line.

3. The memory device of claim 1, wherein the dielectric material comprises a plurality of polymeric molecules.

4. The memory device of claim 3, wherein the polymeric molecules comprise proteins, poly(p-xylylene), acrylic acid polymers, methacrylic acid polymers, polyethylene glycol, urethane polymers, epoxy polymers, silicone polymers, terpenoid polymers, naturally occurring resin polymers, polyisocyanates, or combinations thereof.

5. The memory device of claim 3, wherein the dielectric material further comprises an inorganic salt.

6. The memory device of claim 5, wherein the dielectric material further comprises a permittivity increasing material including Y, Ni, Sm, Sc, Tb, Yb, La, Te, Ti, Zr, Ge, Mg, Pb, Hf, Cu, Ta, Nb, Bi, or a combination thereof, which is substantially evenly distributed throughout the material.

7. The memory device of claim 1, wherein each of the plurality of address lines and/or the plurality of data lines comprises an electrically insulated metal, a carbonized polymer, conductive carbon, or an electrically conductive polymer.

8. The memory device of claim 1, wherein:
the memory device does not include a transistor; or
the memory device includes one or more transistors, and the memory device has a transistor to EESD ratio of less than 1.

9. The memory device of claim 1, wherein each EESD has a logic state determined by a voltage applied between the address line and the data line to which the EESD is coupled.

10. The memory device of claim 9, wherein the EESD has an intrinsic capacitance, the applied voltage modifies the intrinsic capacitance; and the intrinsic capacitance of the EESD remains unchanged when the applied voltage is removed.

11. The memory device of claim 10, wherein:
(i) the EESD has from 2-4096 logic states;
(ii) the EESD has a volume of 0.00001-10000 $\mu m^3$;
(iii) the EESD has a density within a range of from 0.01 kb to 1024 TB per $cm^3$; or
(iv) any combination of (i), (ii), and (iii).

12. The memory device of claim 1, wherein the plurality of address lines or the plurality of data lines is disposed on a non-silicon substrate.

13. The memory device of claim 1 having a layered structure, the layered structure comprising:
a first layer comprising the plurality of address lines arranged in rows;
a second layer comprising the plurality of data lines arranged in columns, wherein there are first spatial separations at each intersection where data line of the second layer crosses an address line of the first layer;
the array of EESDs, wherein the EESDs of the array are located in the first spatial separations and each EESD is coupled in series between an address line of the first layer connected to one side of the EESD and data line of the second layer connected to an opposing side of the EESD;
a third layer of address lines arranged in rows crossing the second layer of data lines, wherein there are second spatial separations at each intersection where an address line of the third layer crosses a data line of the second layer; and
a second array of EESDs, wherein each EESD of the second array is a storage element in the memory device, and wherein the EESDs of the second array are located in the second spatial separations and each EESD of the second array is coupled in series between electrode data line of the second layer connected to one side of the EESD and an address line of the third layer connected to an opposing side of the EESD.

14. The memory device of claim 13, further comprising:
a fourth layer of data lines arranged in columns crossing the third layer of address lines, wherein there are third spatial separations at each intersection where a data line of the fourth layer crosses an address line of the third layer; and
a third array of EESDs, wherein each EESD of the third array is a storage element in the memory device, and wherein the EESDs of the third array are located in the third spatial separations and each EESD of the third array is coupled in series between an address line of the third layer connected to one side of the EESD and a data line of the fourth layer connected to an opposing side of the EESD.

15. A method of refreshing a memory device, comprising:
providing an array of entropic energy storage devices (EESDs), wherein each EESD is a storage element in the memory device;
charging an EESD in the array to a voltage V1, wherein the voltage V1 discharges, at least in part, due to leakage over time;
subsequently determining a capacitance C of the EESD;
determining, based on the capacitance C, the voltage V1, wherein the capacitance C is correlated to the voltage V1 and the capacitance C remains substantially unchanged as the voltage V1 discharges due to leakage; and
recharging the EESD to the voltage V1.

16. The method of claim 15, wherein the capacitance C is correlated to the voltage V1 and the capacitance C remains substantially unchanged as the voltage V1 discharges due to leakage.

17. The method of claim 15, wherein determining the capacitance C of the EESD comprises:
reading a voltage V of the EESD;
applying a perturbing charge dQ to the EESD, wherein the perturbing charge dQ has a magnitude sufficient to induce a change in the voltage V without inducing a change in the capacitance C;
subsequently reading a voltage V' of the EESD; and
determining the capacitance C, where C=dQ/(V'−V).

18. The method of claim 17, wherein the perturbing charge dQ:
has a magnitude approximately equal to a magnitude of discharge due to leakage over time; or
has a magnitude within a range of $1 \times 10^{-15}$ coulombs to $1 \times 10^{-2}$ coulombs.

19. The method of claim 15, wherein determining the initial voltage V1 prior to leakage comprises comparing the capacitance C of the EESD to predetermined capacitance values for the EESD in charged and uncharged states, thereby correlating the capacitance C to the voltage V1.

20. The method of claim 15, wherein recharging the EESD to the voltage V1 comprises:
selecting a voltage V2 sufficient to recharge the EESD to the voltage V1; and writing the selected voltage V2 to the EESD, thereby recharging the EESD to the voltage V1.

* * * * *